United States Patent
Bloomquist

(10) Patent No.: US 6,657,890 B1
(45) Date of Patent: Dec. 2, 2003

(54) MAGNETIC MEMORY DEVICE

(75) Inventor: Darrel R. Bloomquist, Meridian, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/176,715

(22) Filed: Jun. 21, 2002

(51) Int. Cl.[7] ................................................. G11C 11/15
(52) U.S. Cl. .......................... 365/173; 365/158; 365/171
(58) Field of Search ................................. 365/173, 158, 365/171

(56) References Cited

U.S. PATENT DOCUMENTS

| | | | |
|---|---|---|---|
| 5,465,185 A | | 11/1995 | Heim et al. |
| 5,650,889 A | * | 7/1997 | Yamamoto et al. ...... 360/97.01 |
| 5,650,958 A | | 7/1997 | Gallagher et al. |
| 5,766,743 A | * | 6/1998 | Fujikata et al. ............. 428/212 |
| 5,838,608 A | | 11/1998 | Zhu et al. |
| 6,172,904 B1 | * | 1/2001 | Anthony et al. ............. 365/173 |
| 2001/0040819 A1 | * | 11/2001 | Hayashi et al. ............. 365/158 |
| 2002/0074575 A1 | * | 6/2002 | Bangert ...................... 257/211 |

* cited by examiner

Primary Examiner—Michael S. Lebentritt
Assistant Examiner—Jung H. Hur

(57) ABSTRACT

A magnetic memory device has a plurality of write lines and a plurality of memory cells. Each of the plurality of memory cells are operatively positioned between a corresponding pair of the plurality of write lines. Each of the plurality of memory cells has a sense layer and a reference layer separated by an insulating layer. The reference layer of each of the plurality of memory cells includes a high coercivity permanent magnet.

6 Claims, 3 Drawing Sheets

MAGNETIC MEMORY DEVICE

THE FIELD OF THE INVENTION

The present invention generally relates to nonvolatile memory devices. More particularly, the present invention relates to a magnetic memory cell construction for use in nonvolatile memory devices.

BACKGROUND OF THE INVENTION

One type of nonvolatile memory device known in the art relies on magnetic memory cells. Known as magnetic random access memory (MRAM) devices, these devices include an array of magnetic memory cells. The magnetic memory cells may be of different types. For example, a tunneling magnetic junction (TMJ) memory cell or a giant magnetoresistive (GMR) memory cell.

The typical magnetic memory cell includes a layer of magnetic film in which the magnetization is alterable and a layer of magnetic film in which the magnetization is fixed or "pinned" in particular direction. The magnetic film having alterable magnetization may be referred to as a data storage layer and the magnetic film which is pinned may be referred to as a reference layer. The data storage layer and the reference layer are separated by a layer of insulating material.

Conductive traces (commonly referred to as word lines and bit lines, or collectively as write lines) are routed across the array of memory cells. Word lines extend along rows of the memory cells, and bit lines extend along columns of the memory cells. Located at each intersection of a word line and a bit line, each memory cell stores the bit of information as an orientation of a magnetization. Typically, the orientation of magnetization in the data storage layer aligns along an axis of the data storage layer that is commonly referred to as its easy axis. External magnetic fields are applied to flip the orientation of magnetization in the data storage layer along its easy axis to either a parallel or anti-parallel orientation with respect to the orientation of magnetization in the reference layer, depending on the desired logic state.

The orientation of magnetization of each memory cell will assume one of two stable orientations at any given time. These two stable orientations, parallel and anti-parallel, represent logical values of "1" and "0". The orientation of magnetization of a selected memory cell may be changed by supplying current to a word line and a bit line intersecting the selected memory cell. The currents create magnetic fields that, when combined, can switch the orientation of magnetization of the selected memory cell from parallel to anti-parallel or vice versa. Additionally, the write lines can be used to read the logic values stored in the memory cell.

The layers of magnetic material in the memory cell are typically formed as geometrically patterned films such as squares or rectangles, although other shapes are known to be used. One disadvantage of patterned magnetic layer storage structures is that multiple magnetic domains may form in the magnetic layers, rendering the state of the memory cell indeterminate during read operations. Specifically, patterned magnetic layers generate a magnetostatic field that tends to demagnetize the layer. At the edge of the patterned film, this demagnetization field is typically larger than any anisotropy terms maintaining the magnetization perpendicular to the pattern edge. As a result, the magnetostatic field tends to rotate the magnetic vector of the film near the pattern edges.

The magnetization rotation near the edges of the patterned layer form domain walls within the magnetic film, creating multiple domains of magnetic vectors where the magnetic vectors of the domains are not all aligned. When reading the magnetic memory elements, the multiple domains tend to create noise or areas of varying resistance across the memory cell that makes determination of the state of the memory cell difficult or impossible. In addition, variation in the domain states can produce fluctuations in the switching field that can render the memory cell writing process unpredictable.

From the above, it can be seen that maintaining the direction of the magnetization field in the magnetic layers is important. In the case of the fixed or pinned magnetization field of the reference layer, it is thus desirable to fix the field in a manner which minimizes the presence of multiple magnetic domains. In one common memory cell construction, the pinned reference layer may have its magnetic field fixed by interfacial exchange coupling with an adjacent antiferromagnetic layer. An example of the use of an antiferromagnetic layer is illustrated in U.S. Pat. No. 5,650,958 to Gallagher et al. The use of antiferromagnetic materials has several disadvantages including the need for annealing the materials in a magnetic field, corrosiveness of typical antiferromagnetic materials, and the added manufacturing complexity introduced by the presence of the antiferromagnetic layer. It is thus desirable to eliminate the use of antiferromagnetic materials in the construction of magnetic memory cells to reduce or eliminate the disadvantages associated with the use of those materials.

SUMMARY OF THE INVENTION

A magnetic memory device has a plurality of write lines and a plurality of memory cells. Each of the plurality of memory cells are operatively positioned between a corresponding pair of the plurality of write lines. Each of the plurality of memory cells has a sense layer and a reference layer separated by an insulating layer. In one embodiment according to the invention, the reference layer of each of the plurality of memory cells includes a high coercivity permanent magnet which provides a permanently oriented magnetic field without relying on an antiferromagnetic pinning layer.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
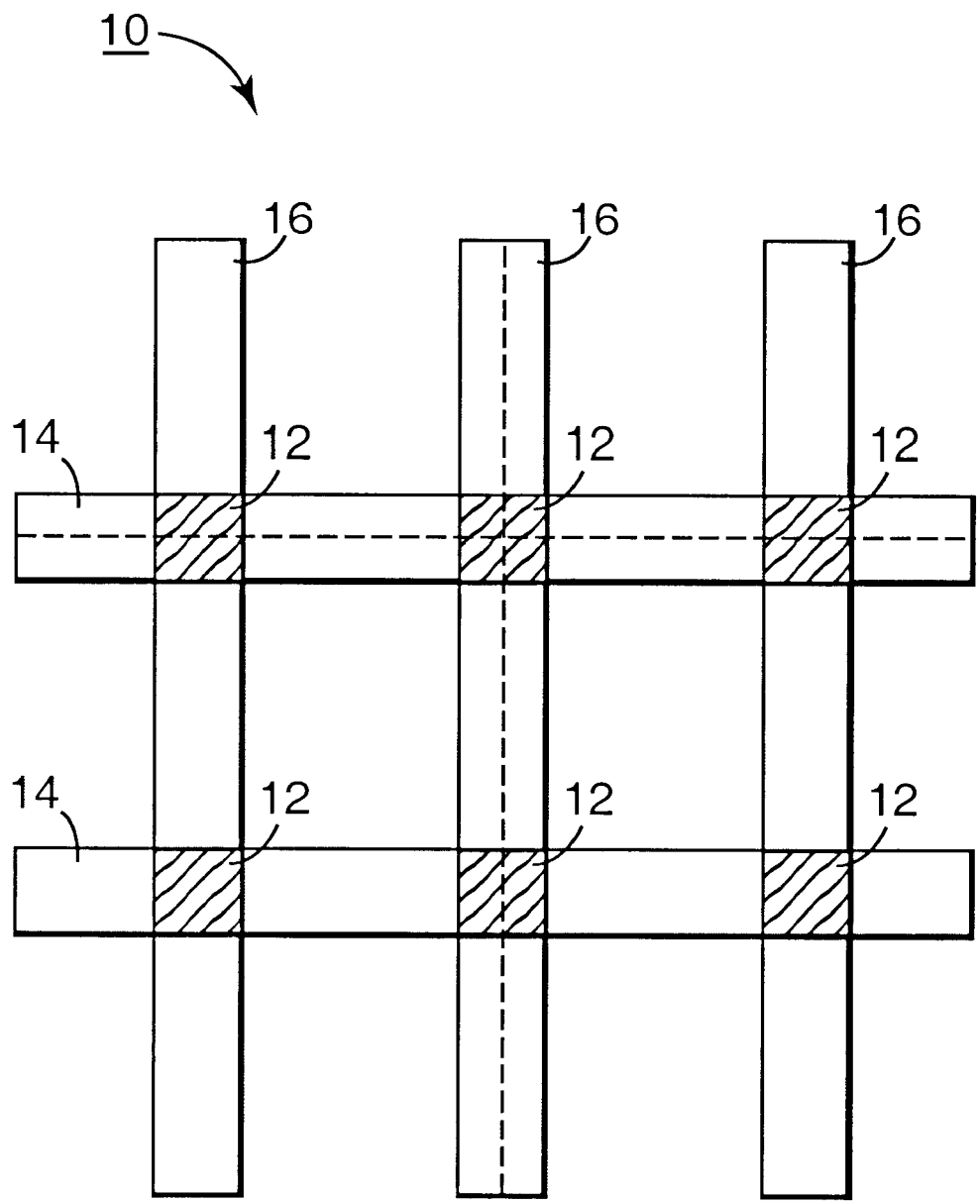
FIGS. 1a and 1b are top and perspective views, respectively, of a prior art magnetic random access memory array.
Figure 1B:
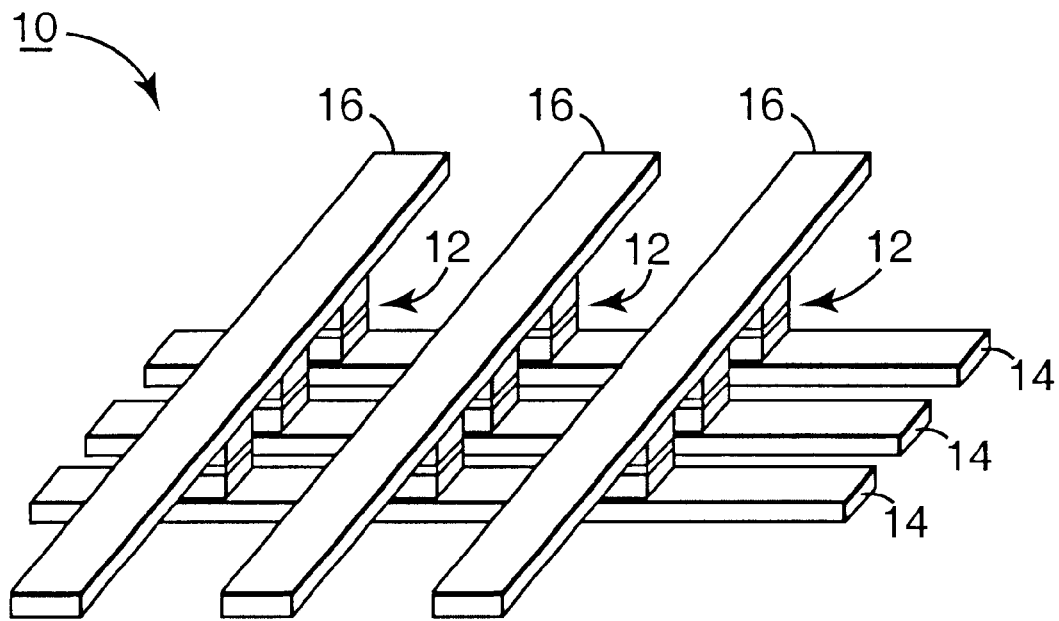

FIGS. 1a and 1b illustrate a simplified prior art MRAM array 10. The array 10 includes memory cells 12, conductive word lines 14, and conductive bit lines 16. Word lines 14 and bit lines 16 are collectively referred to herein as write lines. The memory cells 12 are positioned at each intersection of a word line 14 with a bit line 16, and are positioned between the write lines 14, 16, as more clearly seen in FIG. 1b.

Figure 2:
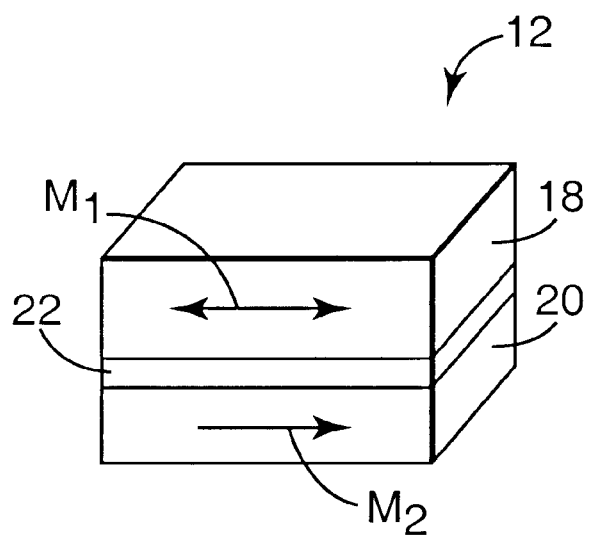
FIG. 2 is perspective view of a prior art magnetic random access memory cell illustrating the orientations of magnetization of active and reference magnetic film layers.
Figure 3:
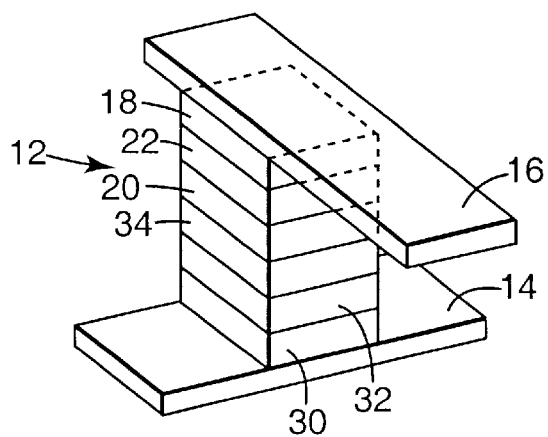
FIG. 3 is a side view of a prior art magnetic random access memory cell illustrating the layers of material forming the memory cell stack.

FIG. 2 illustrates a greatly simplified single memory cell 12 from FIGS. 1a and 1b, and shows how a bit of data is stored in the memory cell 12. A more detailed illustration of a prior art memory cell 12 is shown in FIG. 3 and discussed below. As can be seen in FIG. 2, the memory cell 12 includes an active magnetic data film 18 (the data storage layer) and a pinned magnetic film 20 (the reference layer) which are separated by an insulating layer 22. The orientation of magnetization in the active magnetic data film 18 is not fixed and can assume either of two stable orientations as shown by arrow $M_1$. On the other hand, the pinned magnetic film 20 has a fixed orientation of magnetization shown by arrow $M_2$. The active magnetic data film 18 rotates its orientation of magnetization in response to electrical currents applied to the write lines 14,16 (not shown in FIG. 2) during a write operation to the memory cell 12. The first logic state of the data bit stored in memory cell 12 is indicated when the orientations of magnetization $M_1$ and $M_2$ are parallel to each other. For instance, when orientations of magnetization $M_1$ and $M_2$ are parallel a logic "1" state is stored in the memory cell 12. Conversely, a second logic state is indicated when orientations of magnetization $M_1$ and $M_2$ are anti-parallel to each other. Thus, when orientations of magnetization $M_1$ and $M_2$ are anti-parallel a logic "0" state is stored in the memory cell 12. It should be noted that although FIG. 2 illustrates the active magnetic data film 18 positioned above the pinned magnetic film 20, the pinned magnetic film 20 can be positioned above the active magnetic data film 18.

The resistance of the memory cell 12 differs according to the relative orientations of $M_1$ and $M_2$. When orientations of magnetization $M_1$ and $M_2$ are anti-parallel, i.e., the logic "0" state, the resistance of the memory cell 12 is at its highest. On the other hand, the resistance of the memory cell 12 is at its lowest when the orientations of magnetization $M_1$ and $M_2$ are parallel, i.e., the logic "1" state. As a consequence, the logic state of the data bit stored in the memory cell 12 can be determined by measuring its resistance, using write lines 14, 16.

The construction of a typical prior art memory cell 12 is illustrated in FIG. 3. As discussed above, the memory cell 12 is formed of multiple layers of material. In the illustrated embodiment, a base layer 30 is provided and a seed layer 32 is deposited on the base layer. An antiferromagnetic material layer 34 is then deposited over the seed layer 32. Next, the pinned or reference magnetic layer 20 is deposited over the antiferromagnetic layer 34. The insulating layer 22 and magnetic sense layer 18 are then deposited to complete the memory cell 12. The memory cell 12 structure is annealed in a magnetic field to fix the magnetic field orientation of the antiferromagnetic layer 34. The magnetic field orientation of the pinned reference layer 20 is thus fixed by interfacial exchange coupling with the adjacent antiferromagnetic layer 34.

Materials used in the prior art memory cell 12 as illustrated in FIG. 3 are generally known to those skilled in the art. The base layer 30 may comprise, for example, tantalum or chrome. The seed layer 32 may be, for example, nickel iron alloys, nickel iron chrome alloys, or non magnetic metals such as ruthenium. Suitable antiferromagnetic materials include alloys of iron and manganese, alloys of nickel and manganese, alloys of platinum and manganese, and alloys of iridium and manganese, as well as materials such as nickel oxide or alloys of terbium and cobalt. The reference and sense layers 20, 18 may be single layers of any of the ferromagnetic metals including nickel, iron, or cobalt and alloys of nickel, iron or cobalt. Alternatively, layers 20 and 18 may be composite layers consisting of one or more layers of nickel, iron, cobalt, or alloys of nickel, iron or cobalt. For example a composite layer of a nickel iron alloy and a nickel iron cobalt layer may be formed. The material of insulating layer 22 may include most non-conductive materials such as oxides, nitrides, dielectrics, etc. One specific example of an insulating material for a magnetic tunneling junction is $Al_2O_3$.

Figure 4:
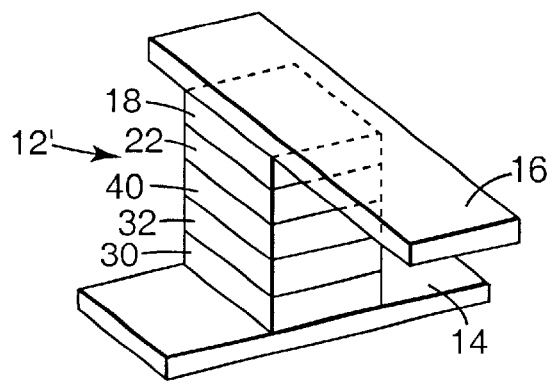
FIG. 4 is a side view of one embodiment of a magnetic random access memory cell according to the invention illustrating the layers of material forming the memory cell stack.

One embodiment of a magnetic memory cell 12' according to the invention is illustrated in FIG. 4. The memory cell 12' comprises a base layer 30, an optionally included seed layer 32, a high coercivity permanent magnet reference layer 40, an insulating layer 22, and a sense layer 18. As can be seen from comparing the structures of FIGS. 3 and 4, the antiferromagnetic layer 34 and pinned reference layer 20 in FIG. 3 are replaced with a high coercivity permanent magnet which serves as the reference layer in the memory cell 12'. As used herein, high coercivity refers to a coercivity that is at least greater than the coercivity of the sense layer.

In one embodiment according to the invention, the reference layer 40 has a coercivity at least 2–3 times greater than the coercivity of the sense layer 18. In another embodiment according to the invention, the reference layer 40 coercivity is on the order of 150 oersteds. In yet another embodiment according to the invention, the coercivity of the permanent magnet reference layer 40 is greater than 300 oersteds. Suitable high coercivity permanent magnet materials are, for example, alloys of cobalt, chromium and platinum, and alloys of cobalt, chromium and tantalum. Alloys of cobalt, platinum and nickel; alloys of cobalt, tantalum and nickel; and alloys of cobalt, chrome, platinum and tantalum may also be used.

The coercivity of thin film ferromagnetic alloys such as CoCrPt is generally sensitive to several factors including the material composition, thickness of the film, and in some cases also on the seed layer material. Generally, as film thickness decreases, the coercivity also generally decreases. However there is a film thickness at which coercivity is maximized. For example, coercivities of 2000 oersteds or more can be achieved with approximately 20 nm of CoCrPt deposited on a CrV underlayer.

Depending on which particular permanent magnet material is used, an optimum seed layer 32 will exist. For example, by using Cr as a seed layer and using CoCrPt as a permanent magnet layer approximately 5 nm thick (typical film thickness for an magnetic tunnel junction reference layer), a coercivity of approximately 400 oersteds should result. In general, by optimizing seed layer material and layer thickness, coercivities of 200–400 oersteds should be obtainable with any of the material mentioned above.

The use of a high coercivity permanent magnet as described above thus provides a permanently oriented magnetic field without relying on an antiferromagnetic pinning layer. The materials of the other memory cell 12' layers are the same as those described with respect to the prior art device shown in FIG. 3.

Figure 5:
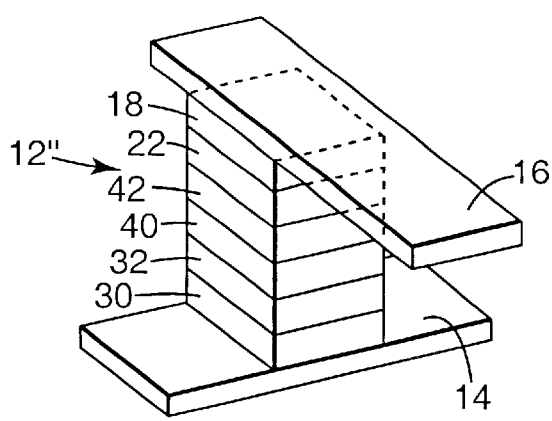
FIG. 5 is a side view of another embodiment of a magnetic random access memory cell according to the invention illustrating the layers of material forming the memory cell stack

Another embodiment of a magnetic memory cell 12" according to the invention is shown in FIG. 5. In the embodiment illustrated in FIG. 5, the high coercivity permanent magnet layer 40 serves as a substrate for a thin ferromagnetic film 42. A thin ferromagnetic film 42 may be used, for example, if the permanent magnet layer 40 does not have high enough spin polarization to create a high tunneling magneto resistance effect. Thus, a very thin (~1 nm) interface layer of any of the materials chosen as "good" sense (or conventional reference) layers might be used, e.g. Ni, Fe, Co, NiFe, CoFe, NiFeCo, etc.

The memory cell embodiments 12', 12" shown in FIGS. 4 and 5 advantageously remove the antiferromagnetic material from the memory cell, reduce the number of material layers in the memory cell, and provide a permanently oriented magnetic field in the reference layer of the memory cells 12', 12". Removing the antiferromagnetic material and reducing the number of layers in the memory cells 12', 12" is beneficial for several reasons. Specifically, manufacturing of the device is simplified, as fewer fabrication steps are required to form the device. Also, antiferromagnetic materials are often corrosive and removing them from the memory cell simplifies material selection and handling. In addition, fewer layers in the memory cells 12', 12" permit the memory cells 12', 12" (and thus the entire MRAM device) to be thinner, which is import in many size constrained applications.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the mechanical, electromechanical and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory device comprising:

a plurality of write lines;

a plurality of memory cells, each of the plurality of memory cells having a sense layer and a reference layer separated by an insulating layer and operatively positioned between a corresponding pair of the plurality of write lines, wherein the reference layer of each of the plurality of memory cells comprises a high coercivity permanent magnet; and a second ferromagnetic layer positioned between the high coercivity permanent magnet reference layer and the insulating layer.

2. The magnetic memory device of claim 1, wherein the second ferromagnetic layer is a material selected from the group consisting of nickel, iron, cobalt, alloys of nickel, alloys of iron and alloys of cobalt.

3. A magnetic memory cell comprising:

a sense layer;

a reference layer having a high coercivity permanent magnet layer; and an insulating layer interposed between the sense layer and the reference layer;

wherein the reference layer further comprises a second ferromagnetic layer positioned between the high coercivity permanent magnet layer and the insulating layer.

4. The memory cell of claim 3, wherein the second ferromagnetic layer is a thin NiFe film.

5. A magnetic memory cell comprising:

a base layer;

a seed layer on the base layer;

a permanent magnet layer on the seed layer;

an insulating layer covering the permanent magnet layer;

a sense layer over the insulating layer; and a second ferromagnetic layer positioned between the permanent magnet layer and the insulating layer.

6. The memory cell of claim 5, wherein the second ferromagnetic layer is a nickel-iron alloy.

\* \* \* \* \*